United States Patent [19]

Hosaka et al.

[11] Patent Number: 4,499,171
[45] Date of Patent: Feb. 12, 1985

[54] POSITIVE TYPE PHOTOSENSITIVE RESIN COMPOSITION WITH AT LEAST TWO O-QUINONE DIAZIDES

[75] Inventors: Yoshihiro Hosaka; Yoichi Kamoshida, both of Yokohama; Yoshiyuki Harita, Kawasaki; Kunihiro Harada, Machida, all of Japan

[73] Assignee: Japan Synthetic Rubber Co., Ltd., Tokyo, Japan

[21] Appl. No.: 484,312

[22] Filed: Apr. 12, 1983

[30] Foreign Application Priority Data

Apr. 20, 1982 [JP] Japan .................................. 57-65759
Mar. 11, 1983 [JP] Japan .................................. 58-40478

[51] Int. Cl.³ .......................... G03C 1/60; G03F 7/26
[52] U.S. Cl. .................................... 430/192; 430/193; 430/311; 430/326; 430/331; 534/561
[58] Field of Search ...................... 430/192, 193, 326; 260/141 D

[56] References Cited

U.S. PATENT DOCUMENTS

| | | | |
|---|---|---|---|
| 3,046,118 | 7/1962 | Schmidt ............................... | 430/193 |
| 3,106,465 | 10/1963 | Neugebauer et al. ............... | 430/193 |
| 3,148,983 | 9/1964 | Endermann et al. ................ | 430/193 |
| 3,180,733 | 4/1965 | Neugebauer et al. ............... | 430/193 |
| 3,402,044 | 9/1968 | Steinhoff et al. .................... | 430/192 |
| 3,802,885 | 4/1974 | Lawson et al. ...................... | 430/192 |
| 4,059,449 | 11/1977 | Rosenkranz et al. ................ | 430/192 |
| 4,189,320 | 2/1980 | Hsieh .................................... | 430/192 |

FOREIGN PATENT DOCUMENTS 1422474 4/1979 Fed. Rep. of Germany ...... 430/193

OTHER PUBLICATIONS

Dinaburg, M. S., "Photosensitive Diazo Cpds", The Focal Press, 1964, pp. 182-191.

Primary Examiner—Charles L. Bowers, Jr.
Attorney, Agent, or Firm—Oblon, Fisher, Spivak, McClelland & Maier

[57] ABSTRACT

A positive type photosensitive resin composition comprising an alkali-soluble novolac resin and (A) a compound represented by the following general formula (I) and a compound represented by the following general formula (II) or (B) a compound represented by the following general formula (III) and a compound represented by the following general formula (IV), wherein the molar ratio of the compound represented by the general formula (I) to the compound represented by the general formula (II) is 6/4-9/1 or the molar ratio of the compound represented by the general formula (III) to the compound represented by the general formula (IV) is 1/9-9/1 and the total amount of the component (A) or (B) is 5-100 parts by weight per 100 parts by weight of the alkali-soluble novolac resin:

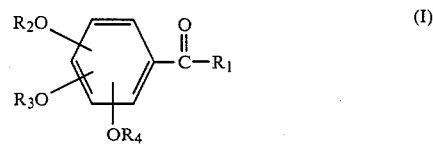

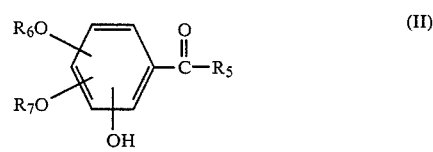

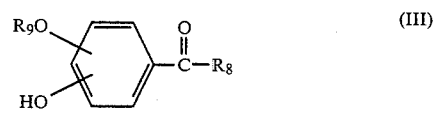

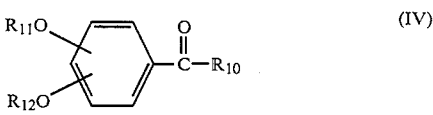

wherein $R_1$, $R_5$, $R_8$ and $R_{10}$, which may be identical or different, represent alkyl groups, aryl groups or aralkyl groups; and $R_2$, $R_3$, $R_4$, $R_6$, $R_7$, $R_9$, $R_{11}$ and $R_{12}$, which may be identical or different, represent 1,2-naphthoquinonediazide-4-sulfonyl groups, 1,2-naphthoquinonediazide-5-sulfonyl groups or 1,2-benzoquinonediazide-4-sulfonyl groups. Said positive type photosensitive resin composition is excellent in both sensitivity and yield of residual film thickness.

18 Claims, No Drawings

POSITIVE TYPE PHOTOSENSITIVE RESIN COMPOSITION WITH AT LEAST TWO O-QUINONE DIAZIDES

This invention relates to a positive type photosensitive resin composition. More particularly, it relates to a positive type photosensitive resin composition having a high sensitivity, a high yield of residual film thickness and an excellent developability and being suitable for use as a photoresist for making integrated circuits, said composition comprising an alkali-soluble novolac resin as a base material.

As the resists for the production of integrated circuits, there are mainly used negative type photoresists prepared by adding a bisazide compound to a cyclized isoprene rubber. However, said negative type photoresists are limited in resolution, and therefore, considered unable to cope with requirements in the future production of integrated circuits in view of the fact that the degree of integration in the integrated circuit is now increasing year by year. On the contrary, positive type photoresists are excellent in resolution and can sufficiently provide for and cope with the increasing miniaturization of integrated circuits.

Most of the conventional positive type photoresists used for the production of integrated circuits have been prepared by adding a 1,2-quinonediazide compound to an alkali-soluble novolac resin to make the resin less soluble in an aqueous alkali solution which is a developer. Since this novolac resin-based positive type photoresist must inevitably contain a large amount of a 1,2-quinonediazide compound, it is inferior in sensitivity to cyclized rubber-based negative type photoresist. In spite of such problems, the novolac resin-based positive type photoresist is used for the production of integrated circuits because of its excellent resolution.

The substance characterizing the novolac resin-based positive type photoresist is the 1,2-quinonediazide compound. 1,2-Quinonediazide compounds are soluble in organic solvents only, and they are insoluble in aqueous alkali solutions. If exposed to ultraviolet rays, however, they are converted into ketenes and further into indenecarboxylic acids which are readily soluble in aqueous alkali solutions. That is to say, a pattern excellent in resolution can be formed by exposing a coating film of novolac resin-based positive type photoresist to ultraviolet rays through a photo-mask and then treating it with an aqueous alkali solution as a developer.

The exposure method for increasing the degree of integration in integrated circuits is being changed from a contact exposure method which is now mainly used to a scale-down projection exposure method. This scale-down projection exposure method comprises stepwise exposing a mask pattern to light instead of exposing it at once, and hence, is excellent as a means for improving resolution, but has the problem that the productivity is low. In order to enhance the productivity in said method, not only is it necessary to improve a scale-down projection exposure apparatus per se, but is it also important to improve the sensitivity of the positive type photoresist used. In addition, the novolac resin-based positive type photoresists which are now commercially available are low in sensitivity, as mentioned above.

Another fault of the prior novolac resin-based positive type photoresists is that the yield of residual film thickness is low. The unexposed coating film of novolac resin-based positive type photoresists is difficult to dissolve in a developer consisting of an aqueous alkali solution as mentioned above, but is not completely insoluble therein. If the solubility of novolac resin itself in an aqueous alkali solution is increased or the amount of a 1,2-quinonediazide compound added is decreased, the solubility of the unexposed coating film of the photoresist in an aqueous alkali solution increases somewhat and the apparent developability after exposure through a photo-mask improves, so that it seems at a glance that the sensitivity has been enhanced. However, the unexposed area to be left as the pattern dissolves somewhat in the developer even though its extent is not so great as in the exposed area, resulting in a decrease in the height of the pattern. The ratio of height before exposure to height after development of the unexposed area to be left as the pattern is called the yield of residual film thickness. Commercially available novolac resin-based photoresists have been low in this yield of residual film thickness. If a positive type photo resist low in yield of residual film thickness is coated on a substrate having a step structure, exposed to light and developed to form a pattern, the pattern cannot sufficiently coat the step structure part and it becomes difficult to prepare a normal integrated circuit.

For overcoming the above-mentioned problems, the present inventors have conducted extensive research. As a result, it has been found that the above-mentioned problems can be overcome by adding a specific 1,2-quinonediazide compound to an alkali-soluble novolac resin.

According to this invention, there is provided a positive type photosensitive resin composition comprising an alkali-soluble novolac resin and (A) a compound represented by the following general formula (I) and a compound represented by the following general formula (II), or (B) a compound represented by the following general formula (III) and a compound represented by the following general formula (IV), wherein the molar ratio of the compound represented by the general formula (I) to the compound represented by the general formula (II) (hereinafter referred to as (I)/(II)) is 6/4-9/1 or the molar ratio of the compound represented by the general formula (III) to the compound represented by general formula (IV) (hereinafter referred to as (III)/(IV)) is 1/9-9/1, and the total amount of the component (A) or (B) is 5-100 parts by weight per 100 parts by weight of the alkali-soluble novolac resin:

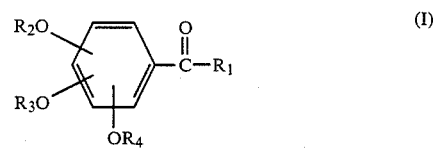

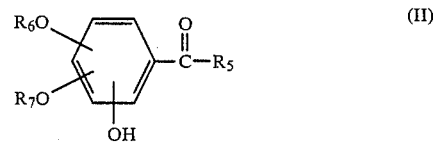

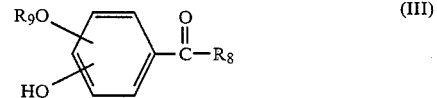

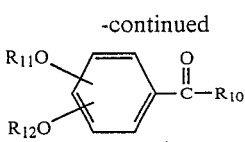 (IV)

wherein $R_1$, $R_5$, $R_8$ and $R_{10}$, which may be identical or different, represent alkyl groups, aryl groups or aralkyl groups, and preferably alkyl groups having 1–12 carbon atoms, particularly preferably 1–6 carbon atoms, aryl groups represented by

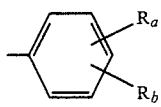

($R_a$ and $R_b$, which may be identical or different, represent hydrogen atoms or alkyl groups having 1–4 carbon atoms) or aralkyl groups represented by

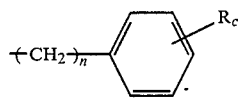

($R_c$ represents a hydrogen atom or an alkyl group having 1–4 carbon atoms and n is 1 or 2); and $R_2$, $R_3$, $R_4$, $R_6$, $R_7$, $R_9$, $R_{11}$ and $R_{12}$, which may be identical or different, represent 1,2-naphthoquinonediazide-4-sulfonyl groups, 1,2-naphthoquinonediazide-5-sulfonyl groups or 1,2-benzoquinonediazide-4-suflonyl groups.

Among the 1,2-quinonediazide compounds used in this invention, the compounds represented by the general formula (I) and the compounds represented by the general formula (II) can be obtained, as mentioned in, for example, U.S. Pat. Nos. 3,046,118, 3,148,983, etc., by condensing 1,2-naphthoquinonediazide-4-sulfonyl chloride, 1,2-naphthoquinonediazide-5-sulfonyl chloride, 1,2-benzoquinonediazide-4-sulfonyl chloride or the like, preferably 1,2-naphthoquinonediazide-5-sulfonyl chloride, with three or two hydroxyl groups of a trihydroxy compounds represented by the general formula (V):

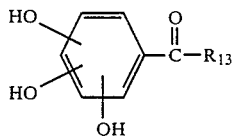 (V)

wherein $R_{13}$ represents an alkyl group, an aryl group or an aralkyl group, such as 2,3,4-trihydroxyphenyl methyl ketone, 2,3,4-trihydroxyphenyl ethyl ketone, 2,3,4-trihydroxyphenyl butyl ketone, 2,3,4-trihydroxyphenyl n-hexyl ketone, 3,4,5-trihydroxyphenyl methyl ketone, 3,4,5-trihydroxyphenyl ethyl ketone, 3,4,5-trihydroxyphenyl butyl ketone, 3,4,5-trihydroxyphenyl n-hexyl ketone, 2,4,6-trihydroxyphenyl methyl ketone, 2,4,6-trihydroxyphenyl ethyl ketone, 2,4,6-trihydroxyphenyl butyl ketone, 2,4,6-trihydroxyphenyl n-hexyl ketone, 2,3,4-trihydroxyphenyl decyl ketone, 2,3,4-trihydroxyphenyl dodecyl ketone, 2,3,4-trihydroxybenzophenone, 3,4,5-trihydroxybenzophenone, 2,4,6-trihydroxybenzophenone, 2,3,4-trihydroxyphenyl benzyl ketone, 3,4,5-trihydroxyphenyl benzyl ketone, 2,4,6-trihydroxyphenyl benzyl ketone and the like in the presence of an alkali catalyst and then purifying the condensation product.

Among the 1,2-quinonediazide compounds used in this invention, the compounds represented by the general formula (III) and the compounds represented by the general formula (IV) can be obtained, as mentioned in, for example, U.S. Pat. Nos. 3,106,465, 3,046,118, etc., by condensing 1,2-naphthoquinonediazide-4-sulfonyl chloride, 1,2-naphthoquinonediazide-5-sulfonyl chloride, 1,2-benzoquinonediazide-4-sulfonyl chloride or the like, preferably 1,2-naphthoquinonediazide-5-sulfonyl chloride, with one or two hydroxyl groups of the dihydroxy compounds represented by the general formula (VI):

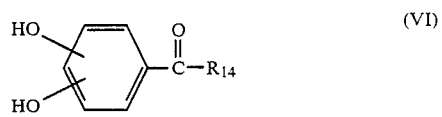 (VI)

wherein $R_{14}$ represents an alkyl group, an aryl group or an aralkyl group, such as 2,4-dihydroxyphenyl methyl ketone, 2,4-dihydroxyphenyl ethyl ketone, 2,4-dihydroxyphenyl butyl ketone, 2,4-dihydroxyphenyl n-hexyl ketone, 3,4-dihydroxyphenyl methyl ketone, 3,4-dihydroxyphenyl ethyl ketone, 3,4-dihydroxyphenyl butyl ketone, 3,4-dihydroxyphenyl n-hexyl ketone, 2,4-dihydroxyphenyl dodecyl ketone, 2,4-dihydroxybenzophenone, 3,4-dihydroxybenzophenone, 2,4-dihydroxyphenyl benzyl ketone, 3,4-dihydroxyphenyl benzyl ketone and the like, in the presence of an alkali catalyst and then purifying the condensed product.

As said alkali catalyst, there may be used inorganic alkalis such as sodium hydroxide, sodium carbonate and the like and amines such as diethylamine, triethylamine and the like.

The compound represented by the general formula (I) thus obtained includes, for example, 2,3,4-trihydroxyphenyl methyl ketone-1,2-naphthoquinonediazide-5-sulfonic acid triester,
2,3,4-trihydroxyphenyl ethyl ketone-1,2-nalphthoquinonediazide-5-sulfonic acid triester,
2,3,4-trihydroxyphenyl butyl ketone-1,2-naphthoquinonediazide-5-sulfonic acid triester,
2,3,4-trihydroxyphenyl n-hexyl ketone-1,2-naphthoquinoendiazide-5-sulfonic acid triester,
3,4,5-trihydroxyphenyl methyl ketone-1,2-naphtoquinonediazide-5-sufonic acid triester,
3,4,5-trihydroxyphenyl ethyl ketone-1,2-naphthoquinonediazide-5-sulfonic acid triester, '2,3,4-trihydroxyphenyl dodecyl ketone-1,2-naphthoquinonediazide-5-sulfonic acid triester,
2,3,4-trihydroxybenzophenone-1,2-naphthoquinonediazide-5-sulfonic acid triester,
3,4,5-trihydroxybenzophenone-1,2-naphthoquinonediazide-5-sulfonic acid triester,
2,3,4-trihydroxyphenyl benzyl ketone-1,2-naphthoquinonediazide-5-sulfonic acid triester,
2,3,4-trihydroxyphenyl methyl ketone-1,2-naphthoquinonediazide-4-sulfonic acid triester,
2,3,4-trihydroxyphenyl ethyl ketone-1,2-naphthoquinonediazide-4-sulfonic acid triester,
2,3,4-trihydroxybenzophenone-1,2-naphthoquinonediazide-4-sulfonic acid triester,
3,4,5-trihydroxybenzophenone-1,2-naphthoquinonediazide-4-sulfonic acid triester, 2,3,4-trihydroxyphenyl benzyl ketone-1,2-naphthoquinonediazide-4-sulfonic acid triester,
3,4,5-trihydroxyphenyl benzyl ketone-1,2-naphthoquinonediazide-4-sulfonic acid triester,
2,3,4-trihydroxyphenyl methyl ketone-1,2-benzoquinonediazide-4-sulfonic acid triester,
2,3,4-trihydroxyphenyl ethyl ketone-1,2-benzoquinonediazide-4-sulfonic acid triester,
2,3,4-trihydroxyphenyl n-hexyl ketone-1,2-benzoquinonediazide-4-sulfonic acid triester,
2,3,4-trihydroxybenzophenone-1,2-benzoquinonediazide-4-sulfonic acid triester,
3,4,5-trihydroxybenzophenone-1,2-benzoquinonediazide-4-sulfonic acid triester,
2,3,4-trihydroxyphenyl benzyl ketone-1,2-benzoquinonediazide-4-sulfonic acid triester,
3,4,5-trihydroxyphenyl benzyl ketone-1,2-benzoquinonediazide-4-sulfonic acid triester,
2,4,6-trihydroxyphenyl benzyl ketone-1,2-benzoquinonediazide-4-sulfonic acid triester, and the like.

The compound represented by the general formula (II) thus obtained includes, for example,
2,3,4-trihydroxyphenyl methyl ketone-1,2-naphthoquinonediazide-5-sulfonic acid diester,
2,3,4-trihydroxyphenyl ethyl ketone-1,2-naphthoquinonediazide-5-sulfonic acid diester,
2,3,4-trihydroxyphenyl n-hexyl ketone-1,2-naphthoquinonediazide-5-sulfonic acid diester,
3,4,5-trihydroxyphenyl methyl ketone-1,2-naphthoquinonediazide-5-sulfonic acid diester,
3,4,5-trihydroxyphenyl ethyl ketone-1,2-naphthoquinonediazide-5-sulfonic acid diester,
2,3,4-trihydroxyphenyl dodecyl ketone-1,2-naphthoquinonediazide-5-sulfonic acid diester,
2,3,4-trihydroxybenzophenone-1,2-naphthoquinonediazide-5-sulfonic acid diester,
3,4,5-trihydroxybenzophenone-1,2-naphthoquinonediazide-5-sulfonic acid diester,
2,3,4-trihydroxyphenyl benzyl ketone-1,2-naphthoquinonediazide-5-sulfonic acid diester,
2,3,4-trihydroxyphenyl methyl ketone-1,2-naphthoquinonediazide-4-sulfonic acid diester,
2,3,4-trihydroxyphenyl ethyl ketone-1,2-naphthoquinonediazide-4-sulfonic acid diester,
2,3,4-trihydroxyphenyl butyl ketone-1,2-naphthoquinonediazide-4-sulfonic acid diester,
2,3,4-trihydroxyphenyl n-hexyl ketone-1,2-naphthoquinonediazide-4-sulfonic acid diester,
2,3,4-trihydroxybenzophenone-1,2-naphthoquinonediazide-4-sulfonic acid diester,
3,4,5-trihydroxybenzophenone-1,2-naphthoquinonediazide-4-sulfonic acid diester,
2,3,4-trihydroxyphenyl benzyl ketone-1,2-naphthoquinonediazide-4-sulfonic acid diester,
3,4,5-trihydroxyphenyl benzyl ketone-1,2-naphthoquinonediazide-4-sulfonic acid diester,
2,3,4-trihydroxyphenyl methyl ketone-1,2-benzoquinonediazide-4-sulfonic acid diester,
2,3,4-trihydroxyphenyl ethyl ketone-1,2-benzoquinonediazide-4-sulfonic acid diester,
2,3,4-trihydroxyphenyl n-hexyl ketone-1,2-benzoquinonediazide-4-sulfonic acid diester,
2,3,4-trihydroxybenzophenone-1,2-benzoquinonediazide-4-sulfonic acid diester,
3,4,5-trihydroxybenzophenone-1,2-benzoquinonediazide-4-sulfonic acid diester,
2,3,4-trihydroxyphenyl benzyl ketone-1,2-benzoquinonediazide-4-sulfonic acid diester, and the like.

The compound represented by the general formula (III) thus obtained includes, for example,
2,4-dihydroxyphenyl methyl ketone-1,2-naphthoquinonediazide-5-sulfonic acid monoester,
2,4-dihydroxyphenyl ethyl ketone-1,2-naphthoquinonediazide-5-sulfonic acid monoester,
3,4-dihydroxyphenyl n-hexyl ketone-1,2-naphthoquinonediazide-5-sulfonic acid monoester,
2,4-dihydroxyphenyl dodecyl ketone-1,2-naphthoquinonediazide-5-sulfonic acid monoester,
2,4-dihydroxybenzophenone-1,2-naphthoquinonediazide-5-sulfonic acid monoester,
3,4-dihydroxyphenyl benzyl ketone-1,2-naphthoquinonediazide-5-sulfonic acid monoester,
2,4-dihydroxyphenyl methyl ketone-1,2-naphtoquinonediazide-4-sulfonic acid monoester,
2,4-dihydroxyphenyl ethyl ketone-1,2-naphthoquinonediazide-4-sulfonic acid monoester,
3,4-dihydroxyphenyl n-hexyl ketone-1,2-naphthoquinonediazide-4-sulfonic acid monoester,
2,4-dihydroxybenzophenone-1,2-naphthoquinonediazide-4-sulfonic acid monoester,
3,4-dihydroxyphenyl benzyl ketone-1,2-naphthoquinonediazide-4-sulfonic acid monoester,
2,4-dihydroxyphenyl methyl ketone-1,2-benzoquinonediazide-4-sulfonic acid monoester,
2,4-dihydroxyphenyl ethyl ketone-1,2-benzoquinonediazide-4-sulfonic acid monoester,
3,4-dihydroxyphenyl n-hexyl ketone-1,2-benzoquinonediazide-4-sulfonic acid monoester,
2,4-dihydroxybenzophenone-1,2-benzoquinonediazide-4-sulfonic acid monoester,
3,4-dihydroxyphenyl benzyl ketone-1,2-benzoquinonediazide-4-sulfonic acid monoester, and the like.

The compound represented by the general formula (IV) thus obtained includes, for example,
2,4-dihydroxyphenyl methyl ketone-1,2-naphthoquinonediazide-5-sulfonic acid diester,
2,4-dihydroxyphenyl ethyl ketone-1,2-naphthoquinonediazide-5-sulfonic acid diester,
3,4-dihydroxyphenyl n-hexyl ketone-1,2-naphthoquinonediazide-5-sulfonic acid diester,
2,4-dihydroxyphenyl dodecyl ketone-1,2-naphthoquinonediazide-5-sulfonic acid diester,
2,4-dihydroxybenzophenone-1,2-naphthoquinonediazide-5-sulofnic acid diester,
3,4-dihydroxyphenyl benzyl ketone-1,2-naphthoquinonediazide-5-sulfonic acid diester,
2,4-dihydroxyphenyl methyl ketone-1,2-naphthoquinonediazide-4-sulfonic acid diester,
3,4-dihydroxyphenyl n-hexyl ketone-1,2-naphthoquinonediazide-4-sulfonic acid diester,
2,4-dihydroxybenzophenone-1,2-naphthoquinonediazide-4-sulfonic acid diester,
3,4-dihydroxyphenyl benzyl ketone-1,2-naphthoquinonediazide-4-sulfonic acid diester,
2,4-dihydroxyphenyl methyl ketone-1,2-benzoquinonediazide-4-sulfonic acid diester,
3,4-dihydroxyphenyl n-hexyl ketone-1,2-benzoquinonediazide-4-sulfonic acid diester,
2,4-dihydroxybenzophenone-1,2-benzoquinonediazide-4-sulfonic acid diester, 3,4-dihydroxyphenyl benzyl ketone-1,2-benzoquinonediazide-4-sulfonic acid diester, and the like.

In this invention, the molar ratio (I)/(II) is 6/4-9/1, preferably 6.3/3.5-8.5/1.5. If the molar ratio (I)/(II) exceeds 9/1, the photosensitive resin composition having a high sensitivity which is the object of this invention cannot be obtained, and the developability becomes worse. In addition, undeveloped portions remain at the pattern edge or at the interface between pattern and substrate, and defects appear in the pattern owing to embrittlement of the photosensitive resin composition. If the molar ratio (I)/(II) is smaller than 6/4, the yield of residual film thickness of the pattern after development decreases, the coverage at the step structure becomes incomplete, and the heat resistance decreases.

In this invention, the molar ratio (III)/(IV) is 1/9-9/1, preferably 2/8-7/3. If the molar ratio (III)/(IV) is smaller than 1/9, the photosensitive resin composition having a high sensitivity which is the object of this invention cannot be obtained. Further, in this case, the compound represented by the general formula (IV) in the photosensitive resin composition cannot undergo sufficient chemical change if the time of exposure is short, and the remaining compound represented by the general formula (IV) results in a deterioration in developability and makes development difficult particularly in the case of fine pattern. In addition, when the patterns is large, undeveloped portions remain in the area to be developed and the surface of the pattern which is to be left may be chipped.

If the molar ratio (III)/(IV) exceeds 9/1, the contribution of alkali-insolubilization to the photosensitive resin composition decreases, so that the pattern after development becomes slender and the yield of residual film thickness becomes low. Thus, the pattern cannot sufficiently cover the step structure portion, and the percentage of good article cannot be increased at the time of producing integrated circuits. Further, the pattern becomes susceptible to deformation at the time of post-baking since the heat resistance is low.

In this invention, the total amount of the component (A), namely the compound represented by the general formula (I) and the compound represented by the general formula (II), or the component (B), namely the compound represented by the general formula (III) and the compound represented by the general formula (IV), is 5-100 parts by weight, preferably 10-50 parts by weight, per 100 parts by weight of the alkali-soluble novolac resin. If the total amount is less than 5 parts by weight, the yield of residual film thickness after development becomes insufficient, and a deformed pattern is produced. If the total amount exceeds 100 parts by weight, no photosensitive resin composition having a high sensitivity can be obtained.

Into the photosensitive resin composition of this invention, other 1,2-quinonediazide compounds may be incorporated in an amount of, for example, 20 parts by weight or less, preferably 10 parts by weight or less, per 100 parts by weight of the alkali-soluble novolac resin.

Examples of said other 1,2-quinonediazide compound include the compounds represented by the general formula (III) and the compounds represented by the general formula (IV) when the compound represented by the general formula (I) and the compound represented by the general formula (II) are both used, while the examples include the compounds represented by the general formula (I) and the compounds represented by the general formula (II) when the compound represented by the general formula (III) and the compound represented by the general formula (IV) are both used. Further, as 1,2-quinonediazide compounds other than mentioned above among said other 1,2-quinonediazide compounds, there may be used compounds represented by the general formula (VII):

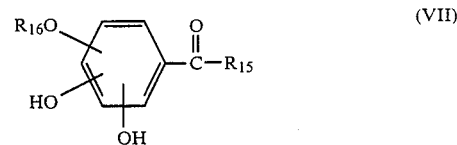

wherein $R_{15}$ is an alkyl group, an aryl group or an aralkyl group, preferably an alkyl group having 1-12 carbon atoms, particularly preferably 1-6 carbon atoms, an aryl group represented by

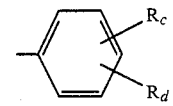

($R_c$ and $R_d$, which may be identical or different, represent hydrogen atoms or alkyl groups having 1-4 carbon atoms, or an aralkyl group represented by

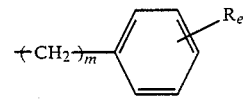

($R_e$ is a hydrogen atom or an alkyl group having 1-4 carbon atoms, and m is 1 or 2), and $R_{16}$ is a 1,2-naphthoquinonediazide-4-sulfonyl group, 1,2-naphthoquinonediazide-5-sulfonyl group or 1,2-benzoquinonediazide-4-sulfonyl group, and compounds (VIII) prepared by condensing 1,2-naphthoquinonediazide-5-sulfonyl chloride with an alkali-soluble novolac resin such as a phenol novolac resin, an o-cresol novolac resin, a m-cresol novolac resin, a p-cresol novolac resin, a phenol/p-cresol novolac resin, an o-cresol/p-cresol novolac resin, a m-cresol/p-cresol novolac resin or the like.

The compound represented by the general formula (VII) includes, for example, 2,3,4-trihydroxyphenyl methyl ketone-1,2-naphthoquinonediazide-5-sulfonic acid monoester,
2,3,4-trihydroxyphenyl ethyl ketone-1,2-naphthoquinonediazide-5-sulfonic acid monoester,
2,3,4-trihydroxyphenyl n-hexyl ketone-1,2-naphthoquinonediazide-5-sulfonic acid monoester,
3,4,5-trihydroxyphenyl methyl ketone-1,2-naphthoquinonediazide-5-sulfonic acid monoester,
3,4,5-trihydroxyphenyl ethyl ketone-1,2-naphthoquinonediazide-5-sulfonic acid monoester,
3,4,5-trihydroxyphenyl butyl ketone-1,2-naphthoquinonediazide-5-sulfonic acid monoester,
2,3,4-trihydroxyphenyl dodecyl ketone-1,2-naphthoquinonediazide-5-sulfonic acid monoester,
2,3,4-trihydroxybenzophenone-1,2-naphthoquinonediazide-5-sulfonic acid monoester,
3,4,5-trihydroxybenzophenone-1,2-naphthoquinonediazide-5-sulfonic acid monoester, 2,3,4-trihydroxyphenyl benzyl ketone-1,2-naphthoquinonediazide-5-sulfonic acid monoester,
2,3,4-trihydroxyphenyl methyl ketone-1,2-naphthoquinonediazide-4-sulfonic acid monoester,
2,3,4-trihydroxyphenyl ethyl ketone-1,2-naphthoquinonediazide-4-sulfonic acid monoester,
2,3,4-trihydroxyphenyl butyl ketone-1,2-naphthoquinonediazide-4-sulfonic acid monoester,
2,3,4-trihydroxyphenyl n-hexyl ketone-1,2-naphthoquinonediazide-4-sulfonic acid monoester,
2,3,4-trihydroxybenzophenone-1,2-naphthoquinonediazide-4-sulfonic acid monoester,
3,4,5-trihydroxybenzophenone-1,2-naphthoquinonediazide-4-sulfonic acid monoester,
2,3,4-trihydroxyphenyl benzyl ketone-1,2-naphthoquinonediazide-4-sulfonic acid monoester,
3,4,5-trihydroxyphenyl benzyl ketone-1,2-naphthoquinonediazide-4-sulfonic acid monoester,
2,3,4-trihydroxyphenyl methyl ketone-1,2-benzoquinonediazide-4-sulfonic acid monoester,
2,3,4-trihydroxyphenyl ethyl ketone-1,2-benzoquinonediazide-4-sulfonic acid monoester,
2,3,4-trihydroxyphenyl n-hexyl ketone-1,2-benzoquinonediazide-4-sulfonic acid monoester,
2,3,4-trihydroxybenzophenone-1,2-benzoquinonediazide-4-sulfonic acid monoester,
3,4,5-trihydroxybenzophenone-1,2-benzoquinonediazide-4-sulfonic acid monoester,
2,3,4-trihydroxyphenyl benzyl ketone-1,2-benzoquinonediazide-4-sulfonic acid monoester, and the like.

The alkali-soluble novolac resin used in this invention can be produced by an addition-condensation reaction of a phenol and an aldehyde preferably in a proportion of 0.7–1 mole of the latter per mole of the former in the presence of an acid catalyst. As the phenol, there may be used phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,6-xylenol, p-phenylphenol and the like. These phenols may be used either alone or in admixture of two or more, considering their alkali-solubility. As the aldehyde, there may be used formaldehyde, paraformaldehyde, furfural and the like. As the acid catalyst, there may be used inorganic acids such as hydrochloric acid, nitric acid, sulfuric acid and the like and organic acids such as formic acid, oxalic acid, acetic acid and the like.

The photosensitive resin composition of this invention is produced by dissolving the above-mentioned alkali-soluble novolac resin and 1,2-quinonediazide compound in a solvent. Solvents usable for this purpose include, for example, glycol ethers such as ethylene glycol monomethyl ether, ethylene glycol monoethyl ether and the like; Cellosolve esters such as methyl Cellosolve acetate, ethyl Cellosolve acetate and the like; aromatic hydrocarbons such as toluene, xylene and the like; ketones such as methyl ethyl ketone, cyclohexanone and the like; and esters such as ethyl acetate, butyl acetate and the like. These solvents may be used in admixture of several members, considering the solubilities of the constituents, vaporization speed of solvent after coating the photosensitive resin composition on a substrate, and the effect of coating film on the surface shape.

Optionally, a storage stabilizer, a dye, a pigment and the like may also be added to the photosensitive resin composition of this invention.

In order to improve the adhesion between the coating film of the photosensitive resin composition of this invention and the substrate made of a silicon oxide film or the like, the substrate may be previously coated with hexamethyldisilazane, chloromethylsilane or the like.

As the developer for the photosensitive resin composition of this invention, there may be used aqueous solutions of alkalis, including inorganic alkalis such as sodium hydroxide, potassium hydroxide, sodium carbonate, sodium silicate, sodium metasilicate, aqueous ammonia and the like; primary amines such as ethylamine, n-propylamine and the like; secondary amines such as diethylamine, di-n-propylamine and the like; tertiary amines such as triethylamine, methyldiethylamine and the like; alkanolamines such as dimethylethanolamine, triethanolamine and the like; quaternary ammonium salts such as tetramethylammonium hydroxide, tetraethylammonium hydroxide and the like; and so on; and aqueous solutions of cyclic amines such as pyrrole, piperidine, 1,8-diazabicyclo(5,4,0)-7-undecene, 1,5-diazabicyclo(4,3,0)-5-nonane and the like. When producing an integrated circuit in which the use of a metal-containing developer is objectionable, the use of an aqueous solution of a quaternary ammonium salt or a cyclic amine is preferable. As the developer, there may also be used an aqueous solution prepared by adding an appropriate quantity of a water-soluble organic solvet, such as methanol or ethanol, or a surfactant to the above-mentioned aqueous alkali solution.

The photosensitive resin composition of this invention is useful not only as a positive type photoresist for the production of an integrated circuit but also as a positive type photoresist for the production of a photomask.

This invention will be illustrated below in more detail referring to Examples. This invention is, however, not limited to the Examples.

EXAMPLE 1

Into a 500-ml flask were charged 30 g of phenol and 70 g of p-cresol, after which 66 ml of 37% by weight aqueous solution of formaldehyde and 0.04 g of oxalic acid were added. Then, the flask was dipped in an oil bath and the contents of the flask were subjected to reaction for 10 hours with stirring while keeping the reaction temperature at 100° C., to synthesize a novolac resin. After the reaction, the pressure in the system was reduced to 30 mmHg to remove the water, and then the inner temperature was elevated to 130° C. to distil off the unreacted compounds. The molten alkali-soluble novolac resin was cooled to room temperature and then recovered.

A photosensitive resin composition solution was then prepared by dissolving 4 g of the alkali-soluble novolac resin thus obtained, 800 mg of 2,3,4-trihydroxybenzophenone-1,2-naphthoquinonediazide-5-sulfonic acid triester (hereinafter, referred to as the compound (a)), 180 mg of 2,3,4-trihydroxybenzophenone-1,2-naphthoquinonediazide-5-sulfonic acid diester (hereinafter, referred to as the compound (b)) and 20 mg of 2,3,4-trihydroxybenzophenone-1,2-naphthoquinonediazide-5-sulfonic acid monoester (hereinafter, referred to as the compound (c)) (the molar ratio of the compound (a)/the compound (b)=7.7/2.3) into 15 g of ethyl Cellosolve acetate and filtering the resulting solution through a filter having a pore diameter of 0.2 μm.

After the above-mentioned photosensitive resin composition solution was applied to a silicon oxide film wafer by means of a spinner, it was prebaked in an oven at 90° C. for 25 minutes to form a coating film of photosensitive resin composition having a thickness of 1 μm. The coating film was exposed to ultraviolet rays having an intensity of 9 mJ/cm² through a photo-mask manufactured by Toppan Insatsu K.K. and then developed with 2.4% by weight aqueous solution of tetramethylamonium hydroxide at 20° C. for 60 seconds, whereby a pattern having a line width of 1.0 μm was resolved. The yield of residual film thickness was 92%. Accordingly, this photosensitive resin composition is understood to have a high sensitivity and a high yield of residual film thickness.

COMPARATIVE EXAMPLE 1

A photosensitive resin composition solution was prepared by dissolving 1 g of the compound (a) used in Example 1 and 4 g of the alkali-soluble novolac resin synthesized in Example 1 in 15 g of ethyl Cellosolve acetate and filtering the solution through a filter having a pore diameter of 0.2 μm. Then, the photosensitive resin composition thus obtained was evaluated by the same methods as in Example 1. As a result, it was found that an ultraviolet exposure energy of 25 mJ/cm² was necessary for resolving a pattern having a line width of 1.0 μm, and hence the photosensitive resin composition had a low sensitivity. Further, unexposed portions remained between the pattern and the substrate, and a part of the pattern was chipped.

EXAMPLES 2 AND 3 AND COMPARATIVE EXAMPLES 2 AND 3

Photosensitive resin composition solutions were prepared by repeating the same procedure as in Example 1, except that the amounts of the compounds (a), (b) and (c) were as shown in Table 1. Then, the photosensitive resin compositions were evaluated by the same methods as in Example 1. The results were as shown in Table 1.

It is apparent from Table 1 that the yield of residual film thickness is low when the proportion of the compound (a) is low.

the photosensitive resin composition was evaluated by the same methods as in Example 1. As a result, it was found that the ultraviolet exposure energy necessary for resolving a pattern having a line width of 1.0 μm was 10.5 mJ/cm² and the yield of residual film thickness was 90%. It is apparent from these results that this photosensitive resin composition is high in both sensitivity and yield of residual film thickness.

EXAMPLE 5

A photosensitive resin composition solution was prepared by repeating the same procedure as in Example 1, except that the compounds (a), (b) and (c) were replaced with 375 mg of 2,4-dihydroxyphenyl methyl ketone-1,2-naphthoquinonediazide-5-sulfonic acid monoester (hereinafter, referred to as the compound (g)) and 625 mg of 2,4-dihydroxyphenyl methyl ketone-1,2-naphthoquinonediazide-5-sulfonic acid diester (hereinafter, referred to as the compound (h) (the molar ratio of the compound (g)/the compound (h)=4.9/5.1). Then, the photosensitive resin composition was evaluated by the same methods as in Example 1. As a result, it was found that the ultraviolet exposure energy necessary for resolving a pattern having a line width of 1.0 μm was 6 mJg/cm² and the yield of residual film thickness was 86%. It is apparent from these results that this photosensitive resin composition is high in both sensitivity and yield of residual film thickness.

COMPARATIVE EXAMPLE 4

A photosensitive resin composition solution was prepared by repeating the same procedure as in Example 1, except that the compounds (a), (b) and (c) were replaced with 1 g of the compound (h). Then, the photosensitive resin composition was evaluated by the same methods as in Example 1. As a result, it was found that an ultraviolet exposure energy of 25 mJ/cm² was necessary for resolving a pattern having a line width of 1.0 μm, and hence, the sensitivity of the composition was low.

TABLE 1

| | Compound (a) (mg) | Compound (b) (mg) | Compound (c) (mg) | Compound (a) Compound (b) (molar ratio) | Sensitivity (mJ/cm²) | Yield of residual film thickness (%) |
|---|---|---|---|---|---|---|
| Example 2 | 880 | 120 | 0 | 8.5/1.5 | 15 | 93 |
| Example 3 | 720 | 250 | 30 | 6.8/3.2 | 7 | 89 |
| Comparative Example 2 | 570 | 430 | 0 | 5/5 | — | 67* |
| Comparative Example 3 | 0 | 1,000 | 0 | 0/10 | — | 46* |

Note
*Yield of residual film thickness at an ultraviolet exposure energy of 6 mJ/cm².

EXAMPLE 4

A photosensitive resin composition solution was prepared by repeating the same procedure as in Example 1, except that the compounds (a), (b) and (c) were replaced with 770 mg of 2,3,4-trihydroxyphenyl n-hexyl ketone-1,2-naphthoquinonediazide-5-sulfonic acid triester (hereinafter, referred to as the compound (d)), 200 mg of 2,3,4-trihydroxyphenyl n-hexyl ketone-1,2-naphthoquinonediazide-5-sulfonic acid diester (hereinafter, referred to as the compound (e)) and 30 mg of 2,3,4-trihydroxyphenyl n-hexyl ketone-1,2-naphthoquinonediazide-5-sulfonic acid monoester (hereinafter, referred to as the compound (f)) (the molar ratio of the compound (d)/the compound (e)=7.4/2.6). Then,

EXAMPLE 6

An alkali-soluble novolac resin was synthesized by repeating the same procedure as in Example 1, except that the 30 g of phenol and the 70 g of p-cresol were replaced with 75 g of m-cresol and 25 g of p-cresol, respectively.

Then, a photosensitive resin composition solution was prepared by dissolving 4 g of the alkali-soluble novolac resin obtained above, 253 mg of 3,4-dihydroxybenzophenone-1,2-naphthoquinonediazide-5-sulfonic acid monoester (hereinafter, referred to as the compound (i)) and 747 mg of 3,4-dihydroxybenzophenone-1,2-naphthoquinonediazide-5-sulfonic acid diester (hereinafter, referred to as the compound (j)) (the molar ratio of the compound (i)/the compound (j)=3.4/6.6) in 15 g of ethyl Cellosolve acetate and filtering the resulting solution through a filter having a pore size of 0.2 μm. Then, the photosensitive resin composition was evaluated by the same methods as in Example 1. As a result, it was found that the ultraviolet exposure energy necessary for resolving a pattern having a line width of 1 μm was 8.9 mJ/cm² and the yield of residual film thickness was 87%. It is apparent from these results that this photosensitive resin composition is high in both sensitivity and yield of residual film thickness.

COMPARATIVE EXAMPLE 5

A photosensitive resin composition solution was prepared by repeating the same procedure as in Example 6, except that the compounds (i) and (j) were used in amounts of 926 mg and 74 mg, respectively, (the molar ratio of the compound (i)/the compound (j)=9.5/0.5). Then, the photosensitive resin composition was evaluated by the same method as in Example 1. As a result, the yield of residual film thickness was 40% when the composition was exposed to 6 mJ/cm² of ultraviolet rays.

What is claimed is:

1. A positive type photosensitive resin composition comprising in admixture an alkali-soluble novolac resin and (A) a photosensitive compound represented by the formula (I):

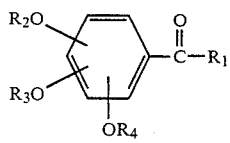

wherein $R_1$ represents an alkyl group, an aryl group or an aralkyl group, and $R_2$, $R_3$ and $R_4$, which are identical or different, represent 1,2-naphthoquinonediazide-4-sulfonyl groups, 1,2-naphthoquinonediazide-5-sulfonyl groups or 1,2-benzoquinonediazide-4-sulfonyl groups, and a photosensitive compound represented by the formula (II):

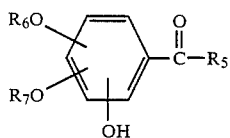

wherein $R_5$ represents an alkyl group, an aryl group or an aralkyl group, and $R_6$ and $R_7$, which are identical or different, represent 1,2-naphthoquinonediazide-4-sulfonyl groups, 1,2-naphthoquinonediazide-5-sulfonly groups or 1,2-benzoquinonediazide-4-sulfonyl groups, or (B) a photosensitive compound represented by the formula (III):

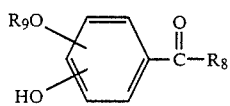

wherein $R_8$ represents an alkyl group, an aryl group or an aralkyl group and $R_9$ represents a 1,2-naphthoquinonediazide-4-sulfonyl group, a 1,2-naphthoquinonediazide-5-sulfonyl group or a 1,2-benzoquinonediazide-4-sulfonyl group, and a photosensitive compound represented by the formula (IV):

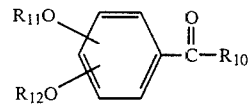

wherein $R_{10}$ represents an alkyl group, an aryl group or an aralkyl group, and $R_{11}$ and $R_{12}$ which are identical or different, represent 1,2-naphthoquinonediazide-4-sulfonyl groups, 1,2-naphthoquinonediazide-5-sulfonyl groups or 1,2-benzoquinonediazide-4-sulfonyl groups, the proportion of the component (A) with the compound (I) and the compound (II) in admixture, or the component (B) with the compound (III) and the compound (IV) in admixture, being 5 to 100 parts by weight per 100 parts by weight of the alkali-soluble novolac resin, the molar ratio of the compound represented by the formula (I) to the compound represented by the formula (II) in the compound (A) being 6:4 to 9:1 and the molar ratio of the compound represented by the formula (III) to the compound represented by the formula (IV) in the component (B) being 2:8 to 7:3, and wherein said compounds having the formulas (I) to (IV) are used in an amount sufficient to produce a resin composition having both excellent sensitivity and yield of residual film thickness.

2. A positive type photosensitive resin composition according to claim 1, wherein $R_1$, $R_5$, $R_8$ and $R_{10}$ in the general formula (I), (II), (III) and (IV) represent alkyl groups having 1–12 carbon atoms, aryl groups represented by the formula,

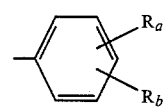

($R_a$ and $R_b$, which may be identical or different, represent hydrogen atoms or alkyl groups having 1–4 carbon atoms) or aralkyl groups represented by the formula,

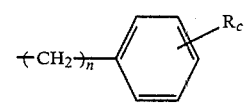

($R_c$ represents a hydrogen atom or an alkyl group having 1–4 carbon atoms and n is 1 or 2).

3. A positive type photosensitive resin composition according to claim 1, wherein the compound represented by the general formula (I) is 2,3,4-trihydroxyphenyl methyl ketone-1,2-naphthoquinonediazide-5-sulfonic acid triester, 2,3,4-trihydroxyphenyl ethyl ketone-1,2-naphthoquinonediazide-5-sulfonic acid triester, 2,3,4-trihydroxyphenyl butyl ketone-1,2-naphthoquinonediazide-5-sulfonic acid triester, 2,3,4-trihydroxyphenyl n-hexyl ketone-1,2-naphthoquinonediazide-5-sulfonic acid triester, 3,4,5-trihydroxyphenyl methyl ketone-1,2-naphthoquinonediazide-5-sulfonic acid triester, 3,4,5-trihydroxyphenyl ethyl ketone-1,2-naphthoquinonediazide-5-sulfonic acid triester, 2,3,4-trihydroxyphenyl dodecyl ketone-1,2-naphthoquinonediazide-5-sulfonic acid triester, 2,3,4-trihydroxybenzophenone-1,2-naphthoquinonediazide-5-sulfonic acid triester, 3,4,5-trihydroxybenzophenone-1,2-naphthoquinonediazide-5-sulfonic acid triester, 2,3,4-trihydroxyphenyl benzyl ketone-1,2-naphthoquinonediazide-5-sulfonic acid triester, 2,3,4-trihydroxyphenyl methyl ketone-1,2-naphthoquinonediazide-4-sulfonic acid triester, 2,3,4-trihydroxyphenyl ethyl ketone-1,2-naphthoquinonediazide-4-sulfonic acid triester, 2,3,4-trihydroxybenzophenone-1,2-naphthoquinonediazide-4-sulfonic acid triester, 3,4,5-trihydroxybenzophenone-1,2-naphthoquinonediazide-4-sulfonic acid triester, 2,3,4-trihydroxyphenyl benzyl ketone-1,2-naphthoquinonediazide-4-sulfonic acid triester, 3,4,5-trihydroxyphenyl benzyl ketone-1,2-naphthoquinonediazide-4-sulfonic acid triester, 2,3,4-trihydroxyphenyl methyl ketone-1,2-benzoquinonediazide-4-sulfonic acid triester, 2,3,4-trihydroxyphenyl ethyl ketone-1,2-benzoquinonediazide-4-sulfonic acid triester, 2,3,4-trihydroxyphenyl n-hexyl ketone-1,2-benzoquinonediazide-4-sulfonic acid triester, 2,3,4-trihydroxybenzophenone-1,2-benzoquinonediazide-4-sulfonic acid triester, 3,4,5-trihydroxybenzophenone-1,2-benzoquinonediazide-4-sulfonic acid triester, 2,3,4-trihydroxyphenyl benzyl ketone-1,2-benzoquinonediazide-4-sulfonic acid triester, 3,4,5-trihydroxyphenyl benzyl ketone-1,2-benzoquinonediazide-4-sulfonic acid triester, or 2,4,6-trihydroxyphenyl benzyl ketone-1,2-benzoquinonediazide-4-sulfonic acid triester.

4. A positive type photosensitive resin composition according to claim 1, wherein the compound represented by the general formula (II) is 2,3,4-trihydroxyphenyl methyl ketone-1,2-naphthoquinonediazide-5-sulfonic acid diester, 2,3,4-trihydroxyphenyl ethyl ketone-1,2-naphthoquinonediazide-5-sulfonic acid diester, 2,3,4-trihydroxyphenyl n-hexyl ketone-1,2-naphthoquinonediazide-5-sulfonic acid diester, 3,4,5-trihydroxyphenyl methyl ketone-1,2-naphthoquinonediazide-5-sulfonic acid diester, 3,4,5-trihydroxyphenyl ethyl ketone-1,2-naphthoquinonediazide-5-sulfonic acid diester, 2,3,4-trihydroxyphenyl dodecyl ketone-1,2-naphtoquinonediazide-5-sulfonic acid diester, 2,3,4-trihydroxybenzophenone-1,2-naphthoquinonediazide-5-sulfonic acid diester, 3,4,5-trihydroxybenzophenone-1,2-naphthoquinonediazide-5-sulfonic acid diester, 2,3,4-trihydroxyphenyl benzyl ketone-1,2-naphthoquinonediazide-5-sulfonic acid diester, 2,3,4-trihydroxyphenyl methyl ketone-1,2-naphthoquinonediazide-4-sulfonic acid diester, 2,3,4-trihydroxyphenyl ethyl ketone-1,2-naphthoquinonediazide-4-sulfonic acid diester, 2,3,4-trihydroxyphenyl butyl ketone-1,2-naphthoquinonediazide-4-sulfonic acid diester, 2,3,4-trihydroxyphenyl n-hexyl ketone-1,2-naphthoquinonediazide-4-sulfonic acid diester, 3,4,5-trihydroxybenzophenone-1,2-naphthoquinonediazide-4-sulfonic acid diester, 2,3,4-trihydroxyphenyl benzyl ketone-1,2-naphthoquinonediazide-4-sulfonic acid diester, 3,4,5-trihydroxyphenyl benzyl ketone-1,2-naphthoquinonediazide-4-sulfonic acid diester, 2,3,4-trihydroxyphenyl methyl ketone-1,2-benzoquinonediazide-4-sulfonic acid diester, 2,3,4-trihydroxyphenyl ethyl ketone-1,2-benzoquinonediazide-4-sulfonic acid diester, 2,3,4-trihydroxyphenyl hexyl ketone-1,2-benzoquinonediazide-4-sulfonic acid diester, 2,3,4-trihydroxybenzophenone-1,2-benzoquinonediazide-4-sulfonic acid diester or 2,3,4-trihydroxyphenyl hexyl ketone-1,2-benzoquinonediazide-4-sulfonic acid diester.

5. A positive type photosensitive resin composition according to claim 3, wherein the compound represented by the general formula (II) is 2,3,4-trihydroxyphenyl methyl ketone-1,2-naphthoquinonediazide-5-sulfonic acid diester, 2,3,4-trihydroxyphenyl ethyl ketone-1,2-naphthoquinonediazide-5-sulfonic acid diester, 2,3,4-trihydroxyphenyl n-hexyl ketone-1,2-naphthoquinonediazide-5-sulfonic acid diester, 3,4,5-trihydroxyphenyl methyl ketone-1,2-naphthoquinonediazide-5-sulfonic acid diester, 3,4,5-trihydroxyphenyl ethyl ketone-1,2-naphthoquinonediazide-5-sulfonic acid diester, 2,3,4-trihydroxyphenyl dodecyl ketone-1,2-naphthoquinonediazide-5-sulfonic acid diester, 2,3,4-trihydroxybenzophenone-1,2-naphthoquinonediazide-5-sulfonic acid diester, 3,4,5-trihydroxybenzophenone-1,2-naphthoquinonediazide-5-sulfonic acid diester, 2,3,4-trihydroxyphenyl benzyl ketone-1,2-naphthoquinonediazide-5-sulfonic acid diester, 2,3,4-trihydroxyphenyl methyl ketone-1,2-naphthoquinonediazide-4-sulfonic acid diester, 2,3,4-trihydroxyphenyl ethyl ketone-1,2-naptoquinonediazide-4-sulfonic acid diester, 2,3,4-trihydroxyphenyl butyl ketone-1,2-naphthoquinonediazide-4-sulfonic acid diester, 2,3,4-trihydroxyphenyl n-hexyl ketone-1,2-naphthoquinonediazide-4-sulfonic acid diester, 3,4,5-trihydroxybenzophenone-1,2-naphthoquinonediazide-4-sulfonic acid diester, 2,3,4-trihydroxyphenyl benzyl ketone-1,2-naphthoquinonediazide-4-sulfonic acid diester, 3,4,5-trihydroxyphenyl benzyl ketone-1,2-naphthoquinonediazide-4-sulfonic acid diester, 2,3,4-trihydroxyphenyl methyl ketone-1,2-benzoquinonediazide-4-sulfonic acid diester, 2,3,4-trihydroxyphenyl ethyl ketone-1,2-benzoquinonediazide-4-sulfonic acid diester, 2,3,4-trihydroxyphenyl n-hexyl ketone-1,2-benzoquinonediazide-4-sulfonic acid diester, 2,3,4-trihydroxybenzophenone-1,2-benzoquinonediazide-4-sulfonic acid diester, 3,4,5-trihydroxybenzophenone-1,2-benzoquinonediazide-4-sulfonic acid diester or 2,3,4-trihydroxyphenyl hexyl ketone-1,2-benzoquinonediazide-4-sulfonic acid diester.

6. A positive type photosensitive resin composition according to claim 1, wherein the compound represented by the general formula (III) is 2,4-dihydroxyphenyl methyl ketone-1,2-naphthoquinonediazide-5-sulfonic acid monoester, 2,4-dihydroxyphenyl ethyl ketone-1,2-naphthoquinonediazide-5-sulfonic acid monoester, 3,4-dihydroxyphenyl n-hexyl ketone-1,2-naphthoquinonediazide-5-sulfonic acid monoester, 2,4-dihydroxyphenyl dodecyl ketone-1,2-naphthoquinonediazide-5-sulfonic acid monoester, 2,4-dihydroxybenzophenone-1,2-naphthoquinonediazide-5-sulfonic acid·monoester, 3,4-dihydroxyphenyl benzyl ketone-1,2-naphthoquinonediazide-5-sulfonic acid monoester, 2,4-dihydroxyphenyl methyl ketone-1,2-naphthoquinonediazide-4-sulfonic acid monoester, 3,4-dihydroxyphenyl n-hexyl ketone-1,2-naphthoquinonediazide-4-sulfonic acid monoester, 2,4-dihydroxybenzophenone-1,2-naphthoquinonediazide-4-sulfonic acid monoester, 3,4-dihydroxyphenyl benzyl ketone-1,2-naphthoquinonediazide-4-sulfonic acid monoester, 2,4-dihydroxyphenyl methyl ketone-1,2-benzoquinonediazide-4-sulfonic acid monoester, 2,4-dihydroxyphenyl ethyl ketone-1,2-benzoquinonediazide-4-sulfonic acid monoester, 3,4-dihydroxyphenyl n-hexyl ketone-1,2-benzoquinonediazide-4-sulfonic acid monoester, 2,4-dihydroxybenzophenone-1,2-benzoquinonediazide-4-sulfonic acid monoester, or 3,4-dihydroxyphenyl benzyl ketone-1,2-benzoquinonediazide-4-sulfonic acid monoester.

7. A positive type photosensitive resin composition according to claim 1, wherein the compound represented by the general formula (IV) is 2,4-dihydroxyphenyl methyl ketone-1,2-naphthoquinonediazide-5-sulfonic acid diester, 2,4-dihydroxyphenyl ethyl ketone-1,2-naphthoquinonediazide-5-sulfonic acid diester, 3,4-dihydroxyphenyl n-hexyl ketone-1,2-naphthoquinonediazide-5-sulfonic acid diester, 2,4-dihydroxyphenyl dodecyl ketone-1,2-naphthoquinonediazide-5-sulfonic acid diester, 2,4-dihydroxybenzophenone-1,2-naphthoquinonediazide-5-sulfonic acid diester, 3,4-dihydroxybenzophenone-1,2-naphthoquinonediazide-5-sulfonic acid diester, 2,4-dihydroxyphenyl methyl ketone-1,2-naphthoquinonediazide-4-sulfonic acid diester, 3,4-dihydroxyphenyl n-hexyl ketone-1,2-naphthoquinonediazide-4-sulfonic acid diester, 2,4-dihydroxybenzophenone-1,2-naphthoquinonediazide-4-sulfonic acid diester, 3,4-dihydroxyphenyl benzyl ketone-1,2-naphthoquinonediazide-4-sulfonic acid diester, 2,4-dihydroxyphenyl methyl ketone-1,2-benzophenonediazide-4-sulfonic acid diester, 3,4-dihydroxyphenyl n-hexyl ketone-1,2-benzoquinonediazide-4-sulfonic acid diester, 2,4-dihydroxybenzophenone-1,2-benzoquinonediazide-4-sulfonic acid diester, or 3,4-trihydroxyphenyl benzyl ketone-1,2-benzoquinonediazide-4-sulfonic acid diester.

8. A positive type photosensitive resin composition according to claim 6, wherein the compound represented by the general formula (IV) is 2,4-dihydroxyphenyl methyl ketone-1,2-naphthoquinonediazide-5-sulfonic acid diester, 2,4-dihydroxyphenyl ethyl ketone-1,2-naphthoquinonediazide-5-sulfonic acid diester, 3,4-dihydroxyphenyl n-hexyl ketone-1,2-naphthoquinonediazide-5-sulfonic acid diester, 2,4-dihydroxyphenyl dodecyl ketone-1,2-naphthoquinonediazide-5-sulfonic acid diester, 2,4-dihydroxybenzophenone-1,2-naphthoquinonediazide-5-sulfonic acid diester, 3,4-dihydroxybenzophenone-1,2-naphthoquinonediazide-5-sulfonic acid diester, 2,4-dihydroxyphenyl methyl ketone-1,2-naphthoquinonediazide-4-sulfonic acid diester, 3,4-dihydroxyphenyl n-hexyl ketone-1,2-naphthoquinonediazide-4-sulfonic cid diester, 2,4-dihydroxybenzophenone-1,2-naphthoquinonediazide-4-sulfonic acid diester, 3,4-dihydroxyphenyl benzyl ketone-1,2-naphthoquinonediazide-4-sulfonic acid diester, 2,4-dihydroxyphenyl methyl ketone-1,2-benzoquinonediazide-4-sulfonic acid diester, 3,4-dihydroxyphenyl n-hexyl ketone-1,2-benzoquinonediazide-4-sulfonic acid diester, 2,4-dihydroxybenzophenone-1,2-benzoquinonediazide-4-sulfonic acid diester, or 3,4-dihydroxyphenyl benzyl ketone-1,2-benzoquinonediazide-4-sulfonic acid diester.

9. A positive type photosensitive resin composition according to claim 1, wherein the molar ratio of the compound respresented by the general formula (I) to the compound represented by the general formula (II) is 6.5:3.5 to 8.5:1.5.

10. A positive type photosensitive resin composition according to claim 1, wherein the amount of the component (A) or (B) is 10–50 parts by weight per 100 parts by weight of the alkali-soluble novolac resin.

11. A positive type photosensitive resin composition according to claim 1 which additionally contains other 1,2-quinonediazide compound in a proportion of 20 parts by weight or less per 100 parts by weight of the alkali-soluble novolac resin.

12. A positive type photosensitive resin composition according to claim 11, wherein said other 1,2-quinonediazide compound is at least one compound selected from the group consisting of compounds represented by the general formulas (III) and (IV), compounds represented by the general formula,

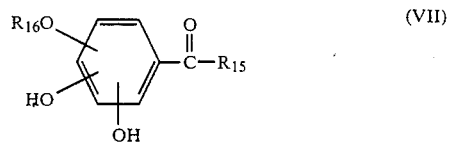

wherein $R_{15}$ is an alkyl group, an aryl group or an aralkyl group and $R_{16}$ is a 1,2-naphthoquinonediazide-4-sulfonyl group, a 1,2-naphthoquinonediazide-5-sulfonyl group or a 1,2-benzoquinonediazide-4-sulfonyl group, and compounds (VIII) prepared by condensing 1,2-naphthoquinonediazide-5-sulfonyl chloride with an alkali-soluble novolac resin, in the case of the component (A), and said other 1,2-quinonediazide compound is at least one compound selected from the group consisting of compounds represented by the general formulas (I), (II) and (VII) and compounds (VIII) in the case of the component (B).

13. A positive type photosensitive resin composition according to claim 1, wherein said alkali-soluble novolac resin is that produced by the addition-condensation reaction of 1 mole of a phenol and 0.7–1 mole of an aldehyde in the presence of an acid catalyst.

14. A positive type photosensitive resin composition according to claim 1 which is in the form of a solution in an organic solvent.

15. A positive type photosensitive resin composition according to claim 1, wherein $R_2$, $R_3$ and $R_4$ in the general formula (I); $R_6$ and $R_7$ in the general formula (II); $R_9$ in the formula (III) and $R_{11}$ and $R_{12}$ in the formula (IV) are 1,2-naphthoquinonediazide-5-sulfonyl groups.

16. A positive type photosensitive resin composition according to claim 15, wherein $R_1$ in the general formula (I); $R_5$ in the general formula (II); $R_8$ in the formula (III) and $R_{10}$ in the general formula (IV) are phenyl, methyl or hexyl.

17. A positive type photosensitive resin composition according to claim 1, which further comprises at least one other 1,2-Quinonediazide compound in a proportion of 3% by wt. or less based on the total weight of the 1,2-Quinonediazide compounds.

18. A positive type photosensitive resin composition according to claim 12, which further comprises at least one other 1,2-Quinonediazide compound in a proportion of 3% by wt. or less based on the total weight of the 1,2-Quinonediazide compounds.

* * * * *